(12) United States Patent
Polomoff et al.

(10) Patent No.: US 10,546,822 B2
(45) Date of Patent: Jan. 28, 2020

(54) SEAL RING STRUCTURE OF INTEGRATED CIRCUIT AND METHOD OF FORMING SAME

(71) Applicant: GLOBALFOUNDRIES INC., Grand Cayman (KY)

(72) Inventors: Nicholas A. Polomoff, Irvine, CA (US); Vincent J. McGahay, Poughkeepsie, NY (US)

(73) Assignee: GLOBALFOUNDRIES INC., Grand Cayman (KY)

(*) Notice: Subject to any disclaimer, the term of this patent is extended or adjusted under 35 U.S.C. 154(b) by 50 days.

(21) Appl. No.: 15/690,398

(22) Filed: Aug. 30, 2017

(65) Prior Publication Data

US 2019/0067210 A1    Feb. 28, 2019

(51) Int. Cl.
*H01L 21/70* (2006.01)
*H01L 23/58* (2006.01)
*H01L 21/768* (2006.01)
*H01L 23/00* (2006.01)

(52) U.S. Cl.
CPC .......... *H01L 23/562* (2013.01); *H01L 23/564* (2013.01); *H01L 23/585* (2013.01)

(58) Field of Classification Search
CPC ................................ H01L 23/562–576; H01L 2224/02125–02126; H01L 2224/02165–02166; H01L 23/585; H01L 23/564
See application file for complete search history.

(56) References Cited

U.S. PATENT DOCUMENTS

| 5,652,459 | A | * | 7/1997 | Chen | H01L 23/5256 257/529 |
| 5,831,330 | A | * | 11/1998 | Chang | H01L 23/585 257/620 |
| 5,926,697 | A | * | 7/1999 | Yaung | H01L 21/761 257/E21.016 |
| 6,967,392 | B2 | | 11/2005 | Tsai et al. | |
| 7,009,222 | B2 | * | 3/2006 | Yang | H01L 23/5258 257/127 |

(Continued)

OTHER PUBLICATIONS

TW Search Report for corresponding Taiwanese Patent Application No. 107121701 dated Apr. 16, 2019, 17 pages.

*Primary Examiner* — Mary A Wilczewski
*Assistant Examiner* — Tsz K Chiu
(74) *Attorney, Agent, or Firm* — Anthony Canale; Hoffman Warnick LLC

(57) ABSTRACT

A seal ring structure of an integrated circuit including a first discontinuous seal wall circumscribing a first portion of the integrated circuit, the first seal wall forming a first pattern on a substrate, and a second discontinuous seal wall circumscribing a second portion of the integrated circuit, the second seal wall forming a second pattern on the substrate and the second portion being at least partially offset from the first portion, wherein the first pattern of the first seal wall interlocks with the second pattern of the second seal wall such that the patterns are interweaved without intersecting, wherein a space is formed between the seal walls, the space creating a non-linear path to the integrated circuit, and wherein the seal ring structure fully circumscribes the integrated circuit. A method of forming such a seal ring structure is also disclosed.

19 Claims, 16 Drawing Sheets

(56) References Cited

U.S. PATENT DOCUMENTS

| | | | |
|---|---|---|---|
| 7,265,438 B2 | 9/2007 | Tsai et al. | |
| 7,466,284 B2* | 12/2008 | Barry | H01Q 1/2283 343/700 MS |
| 7,602,065 B2* | 10/2009 | Hou | H01L 23/562 257/758 |
| 7,646,078 B2 | 1/2010 | Jeng et al. | |
| 7,898,056 B1 | 3/2011 | Keramat et al. | |
| 8,004,066 B2 | 8/2011 | Kim et al. | |
| 8,188,574 B2* | 5/2012 | Angyal | H01L 23/562 257/347 |
| 8,242,586 B2 | 8/2012 | Chang et al. | |
| 8,674,508 B2* | 3/2014 | Wang | H01L 23/585 257/508 |
| 8,729,664 B2 | 5/2014 | Gambino et al. | |
| 8,803,290 B2* | 8/2014 | Frederick, Jr. | H01L 23/562 257/619 |
| 8,933,567 B2 | 1/2015 | Bang et al. | |
| 9,627,332 B1* | 4/2017 | Liang | H01L 23/564 |
| 2003/0218254 A1 | 11/2003 | Kurimoto et al. | |
| 2004/0084777 A1* | 5/2004 | Yamanoue | H01L 23/5227 257/758 |
| 2004/0085704 A1 | 5/2004 | Castillejo | |
| 2004/0150073 A1* | 8/2004 | Matumoto | H01L 23/28 257/630 |
| 2004/0217477 A1* | 11/2004 | Tsai | H01L 23/552 257/758 |
| 2005/0098893 A1* | 5/2005 | Tsutsue | H01L 23/564 257/758 |
| 2006/0202831 A1* | 9/2006 | Horch | G06K 7/0095 340/572.7 |
| 2007/0158849 A1* | 7/2007 | Higashi | G06F 17/5068 257/758 |
| 2007/0172971 A1* | 7/2007 | Boroson | H01L 51/5246 438/26 |
| 2008/0251923 A1* | 10/2008 | Wang | H01L 23/585 257/758 |
| 2009/0140391 A1* | 6/2009 | Hou | H01L 23/562 257/620 |
| 2009/0294929 A1 | 12/2009 | Lee et al. | |
| 2010/0059867 A1 | 3/2010 | Chang et al. | |
| 2010/0244199 A1* | 9/2010 | Sakuma | H01L 21/78 257/618 |
| 2010/0308464 A1* | 12/2010 | Tsutsue | H01L 23/564 257/758 |
| 2011/0215447 A1* | 9/2011 | Furusawa | H01L 23/564 257/637 |
| 2011/0241182 A1* | 10/2011 | Herberholz | H01L 23/564 257/629 |
| 2012/0223445 A1* | 9/2012 | Lehr | H01L 23/544 257/797 |
| 2013/0048980 A1* | 2/2013 | Yang | H01L 23/585 257/48 |
| 2014/0264901 A1* | 9/2014 | Saito | G06F 17/5068 257/773 |
| 2014/0367835 A1* | 12/2014 | Wei | H01L 23/562 257/620 |
| 2018/0122754 A1* | 5/2018 | Tatour | H01L 23/585 |

\* cited by examiner (A)

(B)

(C)

SEAL RING STRUCTURE OF INTEGRATED CIRCUIT AND METHOD OF FORMING SAME

TECHNICAL FIELD

The subject matter disclosed herein relates to seal ring structures for integrated circuits. More specifically, various aspects described herein relate to seal ring structures containing multiple discontinuous seal walls formed into interlocked patterns and methods of forming such seal ring structures.

BACKGROUND

Semiconductor microchips and integrated circuits (ICs) containing analog, digital and RF elements require some level of protection from cracking and crack propagation during the dicing process, as well as protection from moisture penetration. If the chip were to experience either one of these phenomena (i.e., cracking or moisture penetration), the chip's performance will degrade and the chip will experience reliability issues that could potentially result in catastrophic failure of the chip.

To combat this, "crackstop" wall structures have been fabricated and employed to block a propagating crack from entering the inner core of the chip. Such protective wall barriers are found around the periphery of the chip and surround the inner core of the chip, thus forming a continuous ring framing the IC chip.

Typically these walls are made into continuous ring structures that are completely connected walls with absolutely no holes, voids, breaks, gaps or perforations that a crack or moisture could utilize to bypass the blockade or barrier and enter the IC chip core. Such a continuous ring structure prevents moisture degradation and crack propagation. However, due to the unbroken/continuous nature of these walls, essentially one creates an endless ring surrounding and encircling the IC chip core. Employing such a solid metal continuous wall may inadvertently generate and propagate an unwanted noise/signal or crosstalk signal that can interfere with other elements of the chip and the chip's overall activities, operations and performance.

Noise/signal crosstalk generation occurs when a noise source (e.g., digital signal input/output pad, clock input pad, power amplifier, etc.) located within the chip generates noise that is accidently propagated along the continuous solid metal seal wall and undesirably interacts with other elements located within the chip. To alleviate this noise generation and propagation phenomena along the solid continuous metal seal wall, the wall is typically broken up into segments. A significant disadvantage with having an IC seal ring with intermittent interruptions is that such a design inadvertently creates paths that allow for moisture to diffuse and penetrate into the IC's core region, resulting in degradation and eventual failure of the device. These paths also allow cracks to reach the IC's core region, resulting in reliability and failure issues.

BRIEF SUMMARY

Seal ring structures for integrated circuits and methods of forming the same are disclosed. In a first aspect of the disclosure, a seal ring structure of an integrated circuit includes: a first discontinuous seal wall circumscribing a first portion of the integrated circuit, the first seal wall forming a first pattern on a substrate; and a second discontinuous seal wall circumscribing a second portion of the integrated circuit, the second seal wall forming a second pattern on the substrate and the second portion being at least partially offset from the first portion; wherein the first pattern of the first seal wall interlocks with the second pattern of the second seal wall such that the patterns are interweaved without intersecting; wherein a space is formed between the seal walls, the space creating a non-linear path to the integrated circuit; and wherein the seal ring structure fully circumscribes the integrated circuit.

A second aspect of the disclosure includes a method of forming a seal ring structure of an integrated circuit, the method including: forming on a substrate a first discontinuous seal wall circumscribing a first portion of the integrated circuit, the first seal wall having a first pattern, and forming on the substrate a second discontinuous seal wall circumscribing a second portion of the integrated circuit, the second seal wall having a second pattern, wherein the first and second seal walls are formed such that they interlock and the first and second patterns interweave without intersecting and a space is formed between the seal walls such that a non-linear path to the integrated circuit is created, and wherein the seal ring structure fully circumscribes the integrated circuit.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

Figure 1:
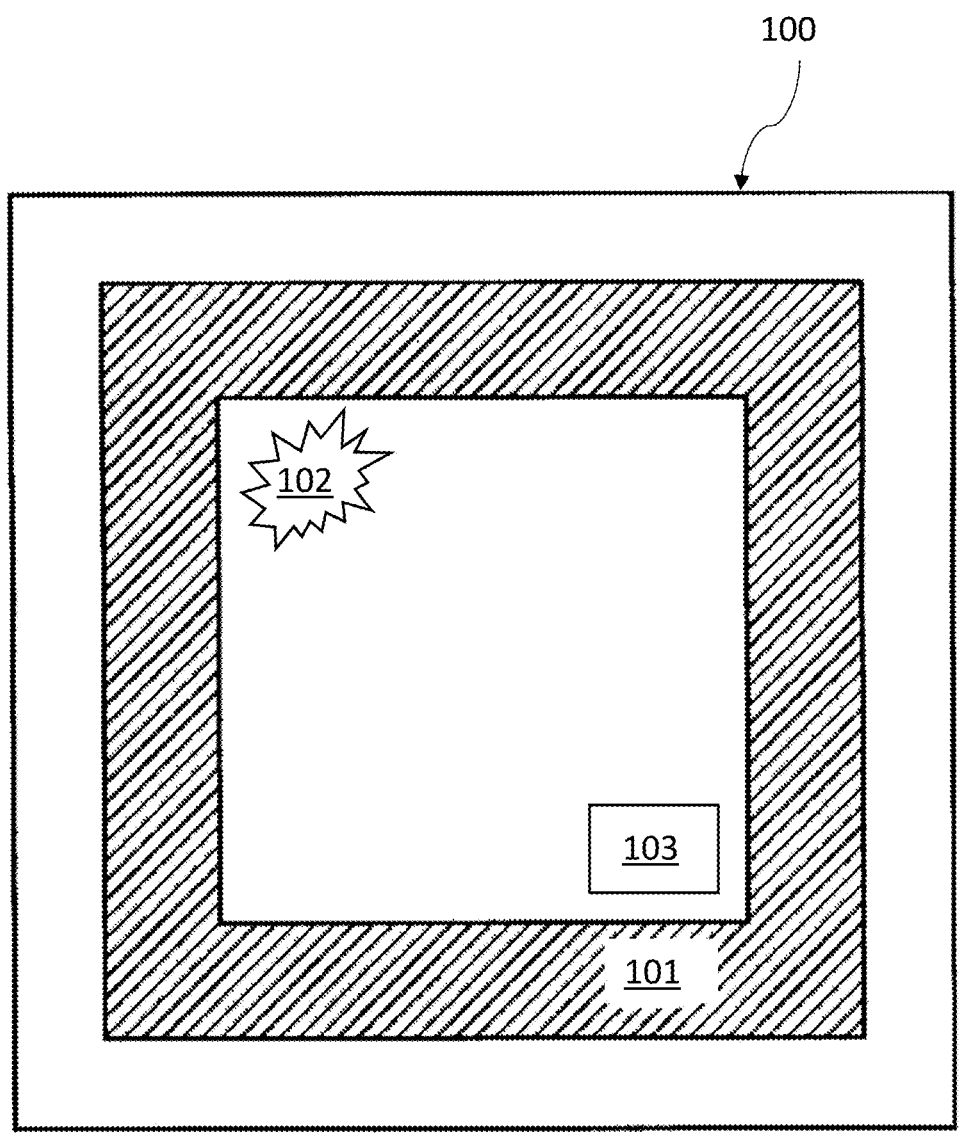
FIG. 1 (prior art) shows an integrated circuit with a conventional uninterrupted seal ring.

It is noted that the drawings of the invention are not necessarily to scale. The drawings are intended to depict only typical aspects of the invention, and therefore should not be considered as limiting the scope of the invention. In the drawings, like numbering represents like elements between the drawings.

DETAILED DESCRIPTION

The subject matter disclosed herein relates to seal ring structures for integrated circuits. More specifically, various aspects described herein relate to seal ring structures containing multiple discontinuous seal walls formed into interlocked patterns, and methods of forming such seal ring structures.

Figure 2:
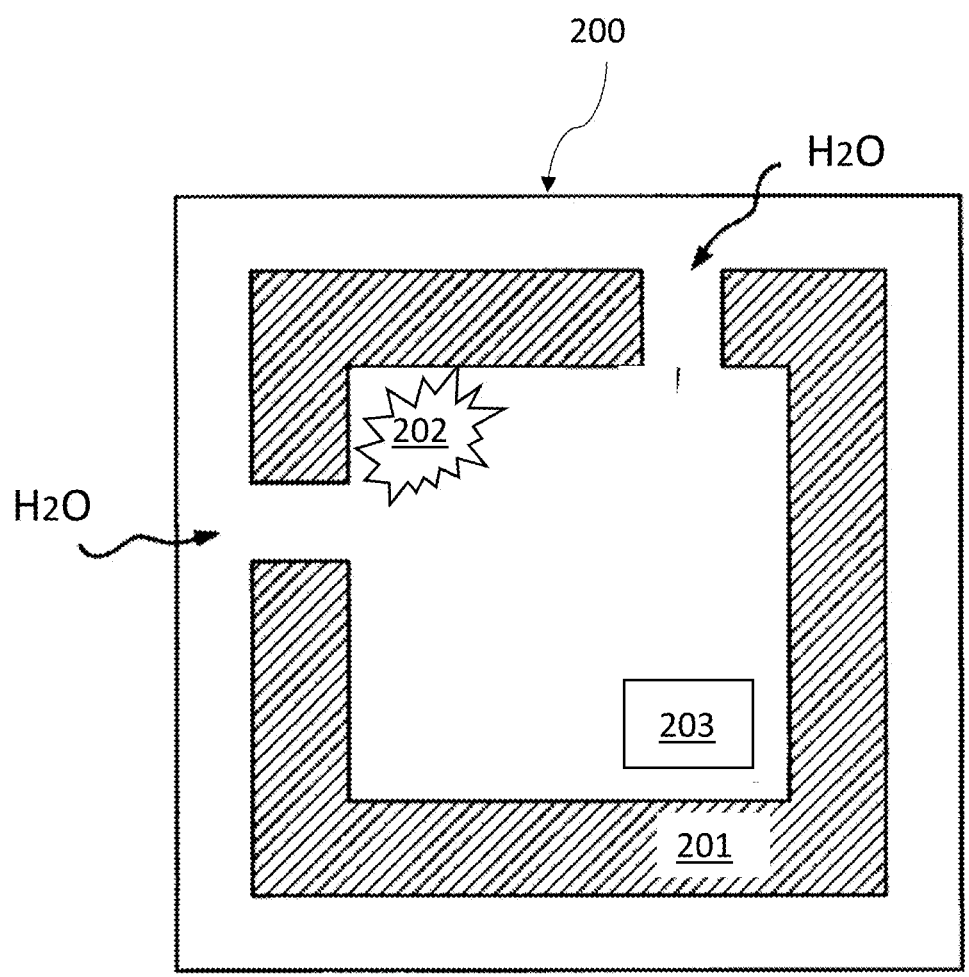
FIG. 2 (prior art) shows an integrated circuit with a conventional seal ring having gaps therein.

As noted above, conventional seal ring structures for ICs are either a continuous seal wall type without any gaps (FIG. 1) or a segmented seal wall type with gaps (FIG. 2). FIG. 1 depicts an IC 100 with a continuous seal wall 101. A noise source 102 may create a noise that can propagate along continuous seal wall 101 and interfere with an element 103 on the IC even though element 103 is located as far away as possible from noise source 102. FIG. 2 depicts an IC 200 with a segmented seal wall 201 containing gaps. While a noise created by a noise source 202 cannot propagate along seal wall 201 to an element 203 due to the gaps within seal wall 201, such gaps allow for water ingress (see H$_2$O arrows). It is also noted that cracks could propagate through such gaps as well.

In contrast to such conventional seal ring structures, the seal ring structures according to embodiments of the disclosure utilize discontinuous and interlocking seal walls that have patterns interweaved with one another without intersecting. Such structures contain non-linear paths to the IC's core; however, the structures according to embodiments of the disclosure prevent crack propagation and moisture ingress while also preventing unwanted noise propagation.

More specifically, a seal ring structure of an IC according to an embodiment of the disclosure includes a first discontinuous seal wall circumscribing a first portion of the integrated circuit, the first seal wall forming a first pattern on a substrate; and a second discontinuous seal wall circumscribing a second portion of the integrated circuit, the second seal wall forming a second pattern on the substrate and the second portion being at least partially offset from the first portion; wherein the first pattern of the first seal wall interlocks with the second pattern of the second seal wall such that the patterns are interweaved without intersecting; wherein a space is formed between the seal walls, the space creating a non-linear path to the integrated circuit; and wherein the seal ring structure fully circumscribes the integrated circuit. The first and second patterns can be, for instance, concentric open spirals (sometimes referred to herein as "swirl"), complementary jigsaw maze shapes, and serrated shapes.

Figure 3:
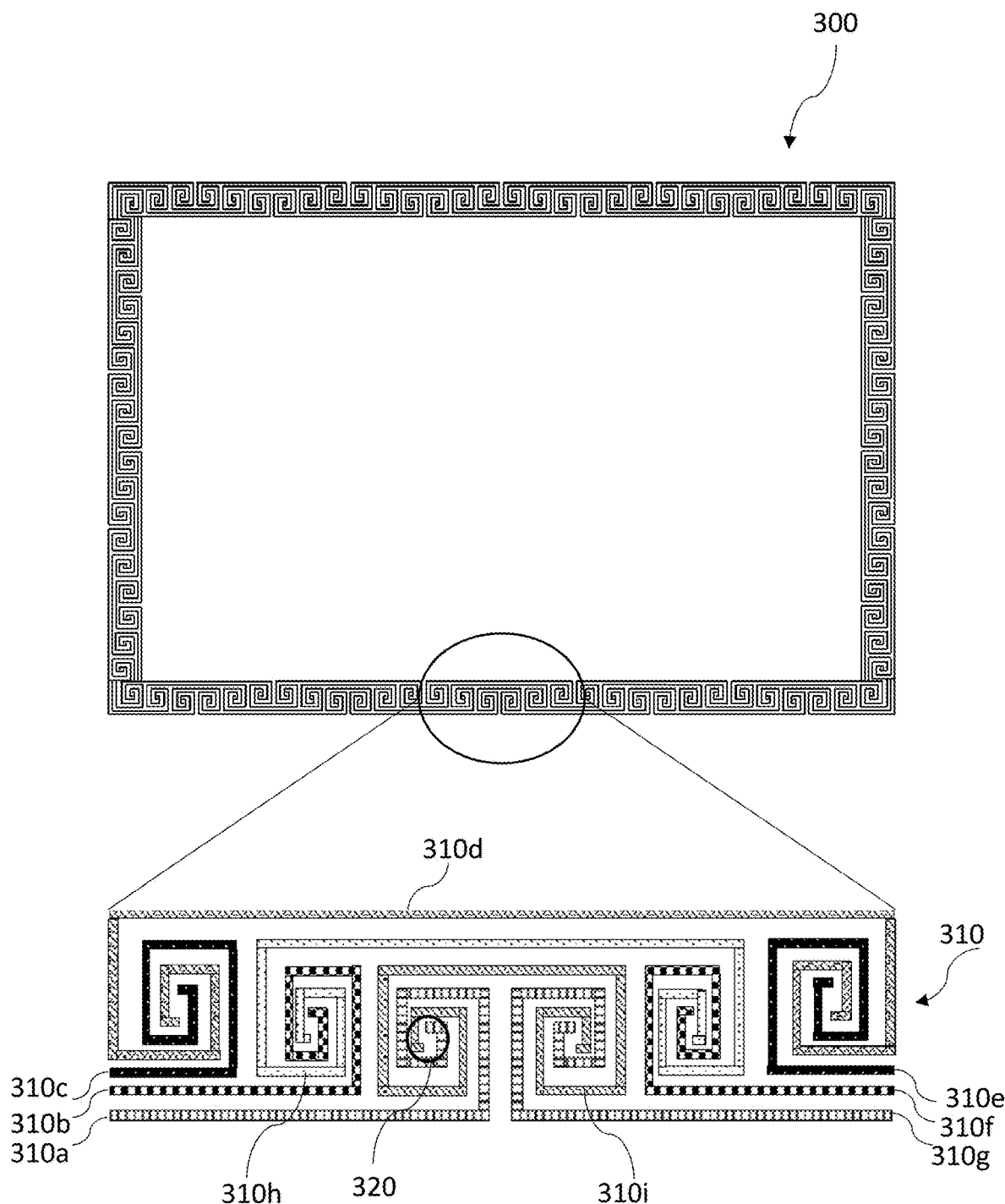
FIG. 3 shows a seal ring structure of an embodiment of the disclosure wherein the patterns of the individual seal walls are concentric open spirals ("swirl").

FIG. 3 depicts a seal ring structure 300 of an IC according to a concentric open spiral embodiment of the disclosure. More specifically, seal ring structure 300 includes a plurality of individual seal walls 310 (see 310a through 310i), each seal wall 310 having a concentric open spiral pattern interweaved (without intersecting) with another seal wall 310 having a concentric open spiral pattern. As can be seen in FIG. 3, a given seal wall 310 can have one or more concentric open spirals, and the concentric open spirals can be interweaved such that both spirals wind clockwise or both spirals wind counter-clockwise to an open spiral center 320. In other words, seal walls 310 are interweaved and wind around one another in such a way that spiral center 320 remains unblocked (or, open) such that the space between seal walls 310 also remains unblocked.

Figure 4:
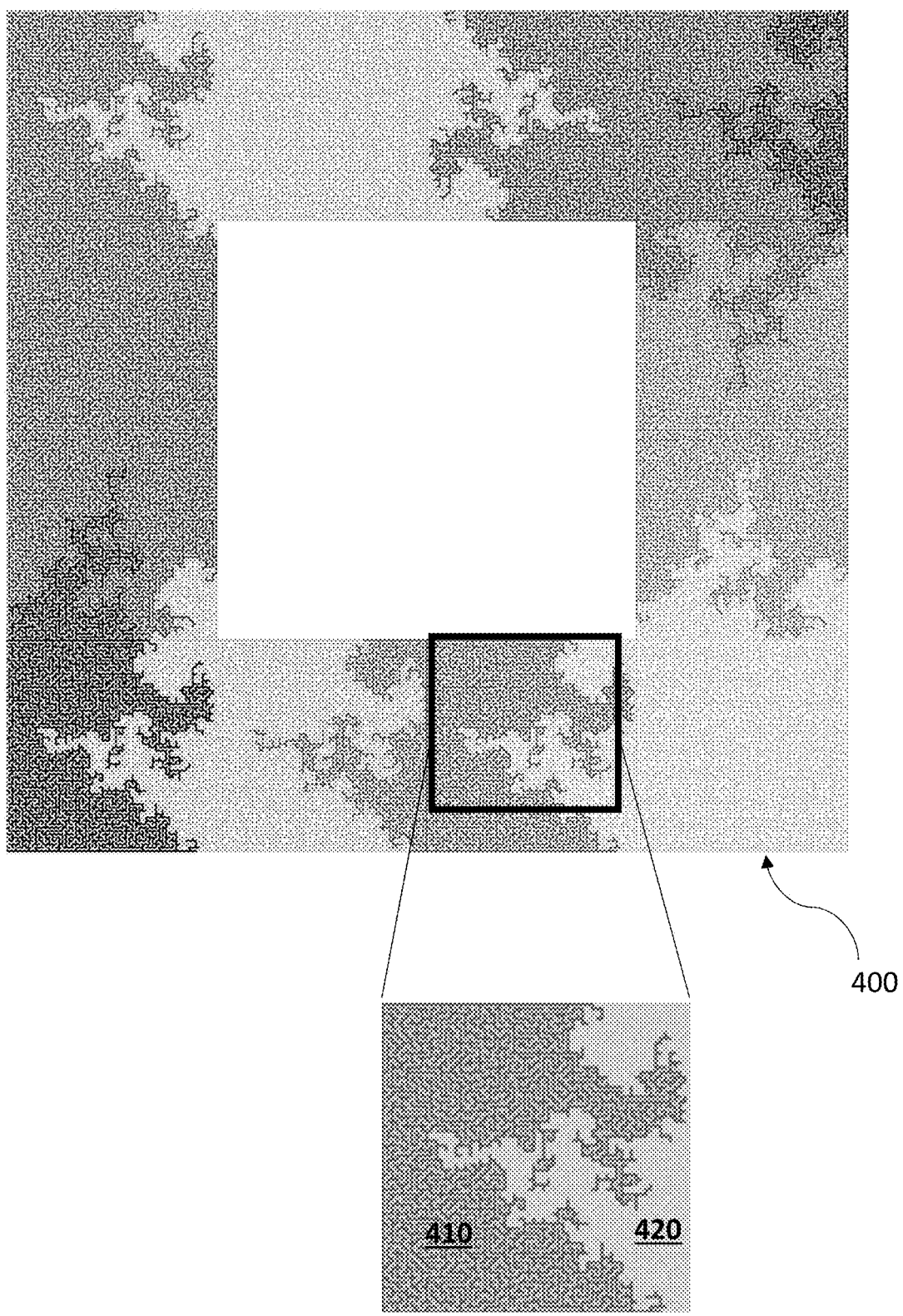
FIG. 4 shows a seal ring structure of an embodiment of the disclosure wherein the patterns of the individual seal walls are complementary jigsaw maze patterns.

FIG. 4 depicts a seal ring structure 400 of an IC according to a complementary jigsaw maze embodiment of the disclosure. More specifically, seal ring structure 400 includes at least a first seal wall 410 having a first pattern of a jigsaw maze and a second seal wall 420 having a second pattern of the jigsaw maze, patterns of seal walls 410 and 420 being complementary to one another but remaining unconnected. The noted jigsaw maze can include any random shapes and any number of random shapes therein so long as the shapes are complementary to one another (e.g., fit together like a jigsaw puzzle) and do not overlap each other (i.e., remain unconnected).

Figure 5:
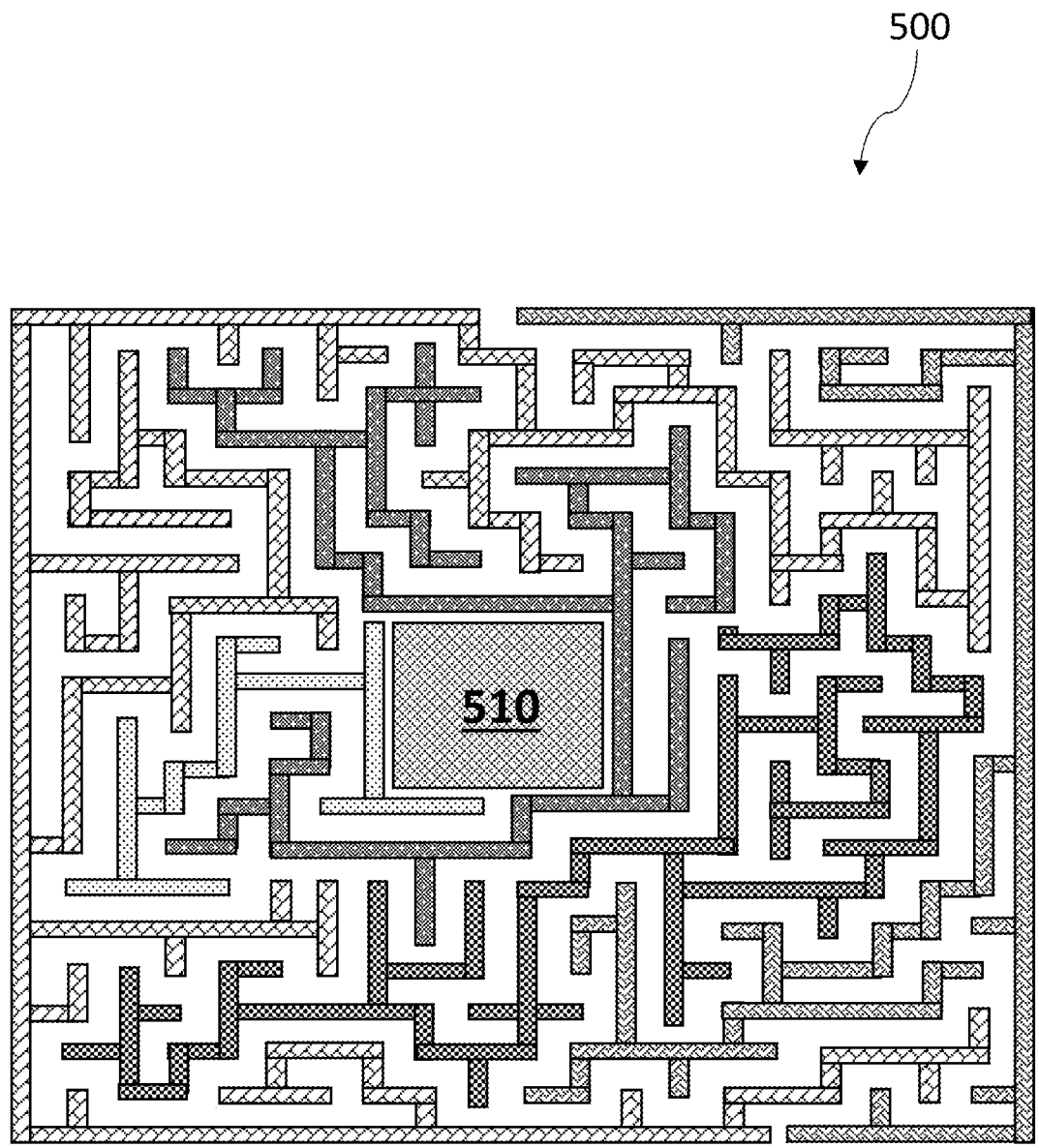
FIG. 5 shows a seal ring structure of an embodiment of the disclosure wherein the patterns of the individual seal walls form a simple maze with the IC chip core being capable of being inlayed within the maze itself.

FIG. 5 depicts a seal ring structure 500 of an IC according to a simple maze embodiment of the disclosure. Seal ring structure 500 of FIG. 5 having a maze-type pattern differs from seal ring structure 400 of FIG. 4 having a maze-type pattern in that seal ring structure 500 does not include individual maze segments that are summed together to create a border frame around the IC's core region, rather the IC's core region can be inlayed within the maze itself. In other words, seal ring structure 500 is not simply a maze surrounding the IC's core region, seal ring structure 500 is unique in that IC core region 510 is integrated with the maze. It is noted here that the maze-type pattern of seal ring structure 500 is not drawn to the same scale as the IC core region 510. The scale of the maze-type pattern of seal ring structure 500 has been exaggerated to show detail.

Figure 6:
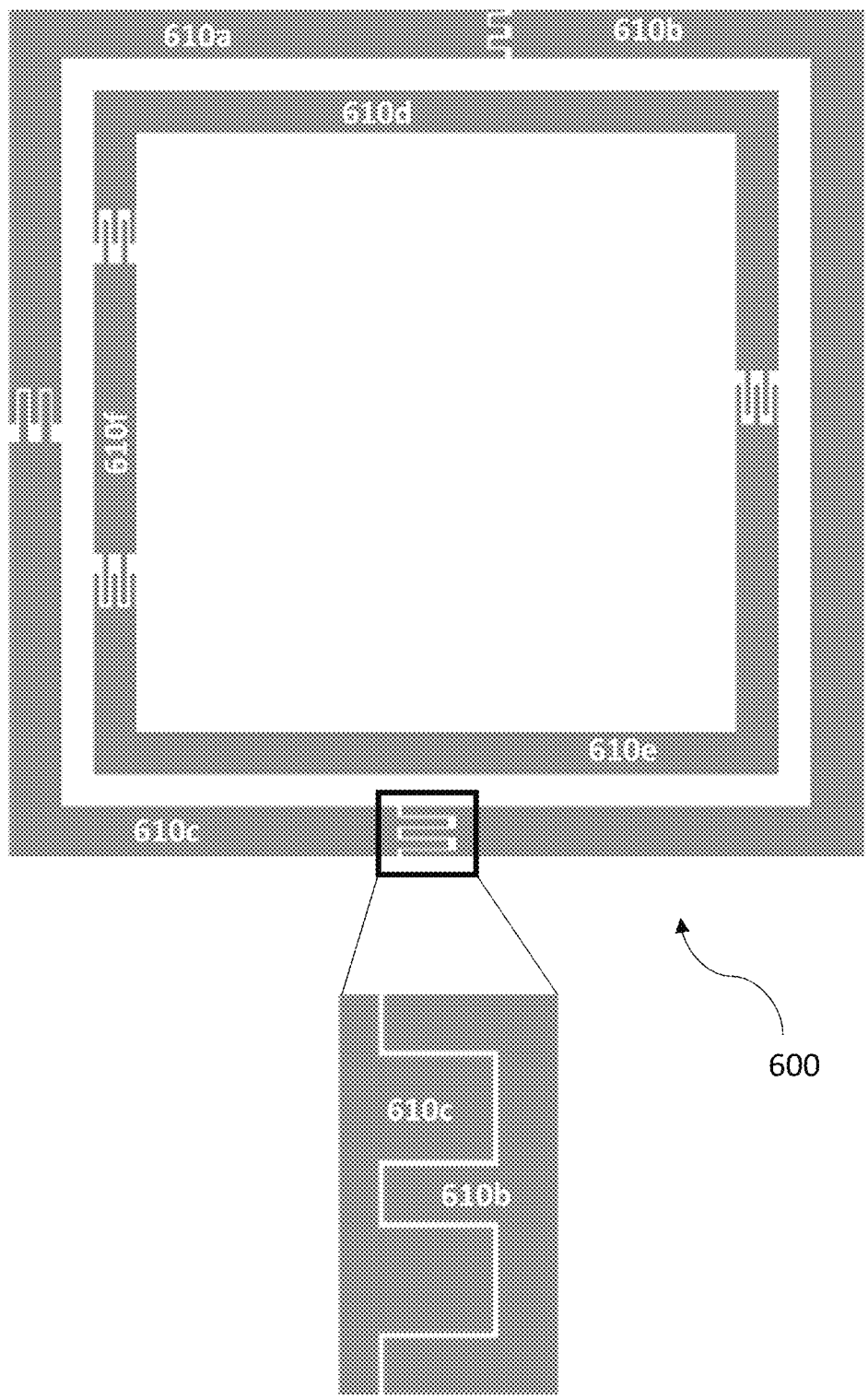
FIG. 6 shows a seal ring structure of an embodiment of the disclosure wherein the patterns of the individual seal walls are serrated (in this instance, a tooth pattern).

FIG. 6 depicts a seal ring structure 600 of an IC according to a serrated embodiment of the disclosure. More specifically, seal ring structure 600 includes a plurality of individual seal walls 610 (see 610a through 610f), each seal wall 610 having a serrated pattern (in this instance, a squared tooth pattern).

Figure 7:
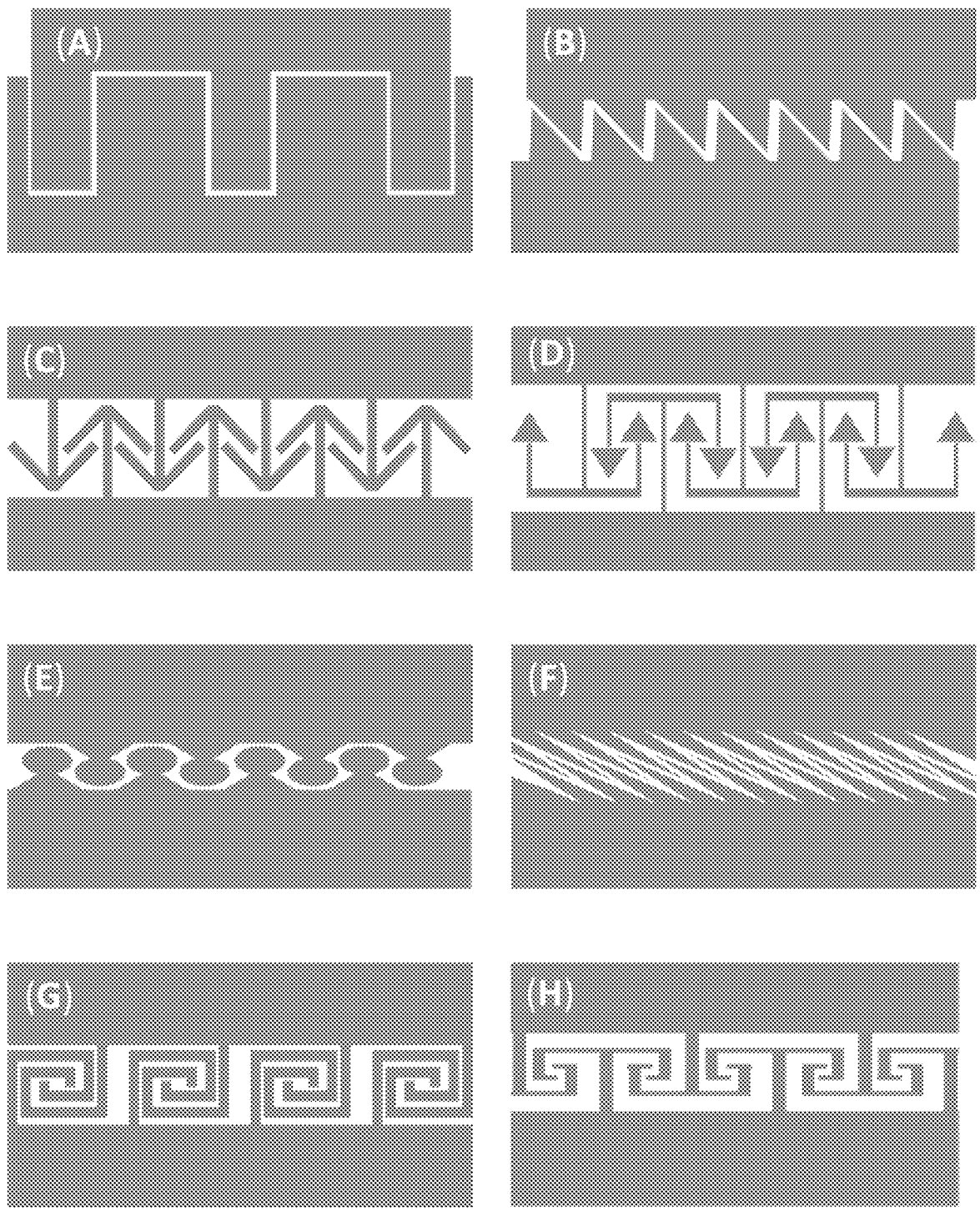
FIG. 7 shows differing serrated patterns of seal walls according to embodiments of the disclosure, namely (A) a squared tooth pattern, (B) a sawtooth pattern, (C) an arrow pattern, (D) an anchor pattern, (E) a zipper pattern, (F) a lightning bolt pattern, (G) a hook pattern and (H) an elephant tail pattern.

FIG. 7 depicts possible serrated patterns such as, for example, (A) squared tooth, (B) sawtooth, (C) arrow, (D) anchor, (E) zipper, (F) lightning bolt, (G) hook, and (H) elephant tail. Any serrated pattern can be used as the pattern for the seal walls of the seal ring structure of the disclosure. For example, tooth-like patterns can include not only triangular and square shaped teeth like those shown in FIGS.

7(A) and 7(B) but also teeth in the shape of a pentagon, hexagon, heptagon, octagon and so on, and even rounded teeth (e.g., semicircular).

Furthermore, the 45° and 90° angles of the arrow and anchor patterns as shown in FIGS. 7(C) and 7(D) can be increased or decreased, and the straight-line segments of the patterns may be rounded (or, curved), so long as the space between parts of the pattern remains open.

Regarding the zipper pattern of FIG. 7(E), it is noted that the crown (or, top) of a single tooth can have varying shapes, for instance, elliptical (as shown), oval (or, egg-shaped), triangular (point up or flat bottom up) or rod-shaped.

The lightning bolt pattern as shown in FIG. 7(F) is uniform in each direction, however the lightning bolt pattern can have varying spaces between each zig or zag, varying lengths for each zig or zag, and varying widths for each zig or zag. Moreover, the sharp angular nature of each zig-zag can be softened (or, rounded).

FIGS. 7(G) and 7(H) show a hook pattern and an elephant tail pattern wherein each pattern has 90° squared corners as it turns in on itself (without connecting back to itself), such squared corners can be non-square with angles of greater than or less than 90° and can even be rounded. The elephant tail pattern differs from the hook pattern in that the hook pattern has one continuous segment that turns in on itself (without connecting back to itself) with 4 corners, whereas the elephant tail pattern has two segments, each segment turning in on itself (without connecting back to itself) with 3 corners.

Each of the seal wall patterns noted above (i.e., swirl, jigsaw maze, serrated) have an interlocking design where the patterns are interweaved without intersecting and where a space is formed between the seal walls, the space creating a non-linear path, the non-linear path starting outside the IC core and traversing to the IC core. Such non-linear paths can prevent a crack from entering the IC core because a crack propagation path cannot go backwards without defying the laws of physics. A crack has an external energy source from which the crack derives its propagation. The energy source defines a propagation direction. Since the non-linear paths of the disclosure are designed such that the path must traverse every direction at some point, and since the energy source only defines a propagation direction (not all propagation directions), a crack cannot propagate backwards.

Figure 8:
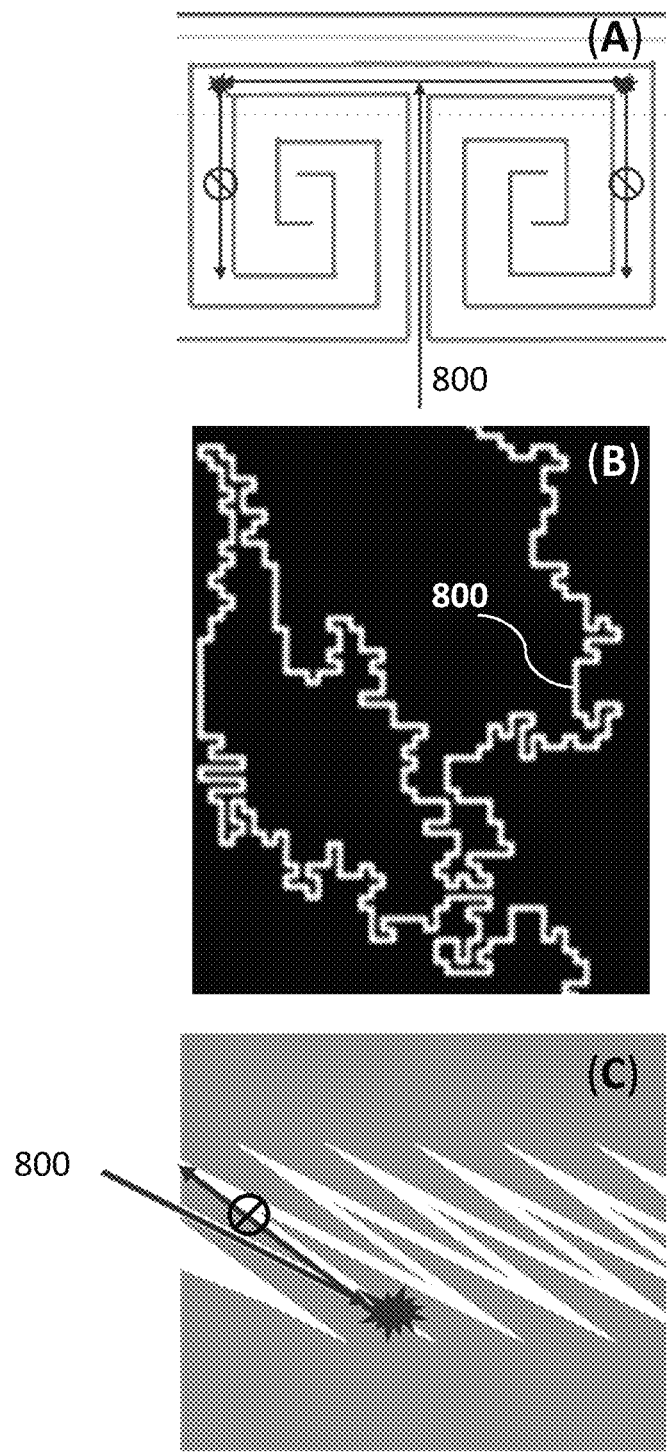
FIG. 8 shows crack propagation paths for seal ring structures of embodiments of the disclosure, the seal ring structures having (A) a swirl pattern, (B) a jigsaw maze pattern and (C) a serrated (in this instance, lightning bolt) pattern.

FIG. 8 depicts propagation paths 800 that a crack would have to follow to damage the IC for (A) a swirl pattern, (B) a jigsaw maze pattern and (C) a serrated (in this instance, lightning bolt) pattern. As illustrated, paths 800 as shown in FIG. 8 are extremely complex and thus practically impossible for a crack to follow because a crack cannot turn back on itself or propagate in a number of directions as it moves forward. As can also be seen from FIG. 8(B), non-linear path 800 of the jigsaw maze embodiments is formed at the interface between the first and second patterns (see jagged white line).

In addition to the physical limits created by the non-linear paths of the seal ring structures according to embodiments of the disclosure (i.e., propagating in every direction as path is traversed), the noted paths are long, for example, 150 micrometers (μm) or more. In some embodiments, the paths are 150 to 300 micrometers (μm) in length. This long length makes it more difficult for moisture ingress to the IC prime as evaporation/dehydration naturally occurs the longer the path the moisture must follow.

Figure 9:
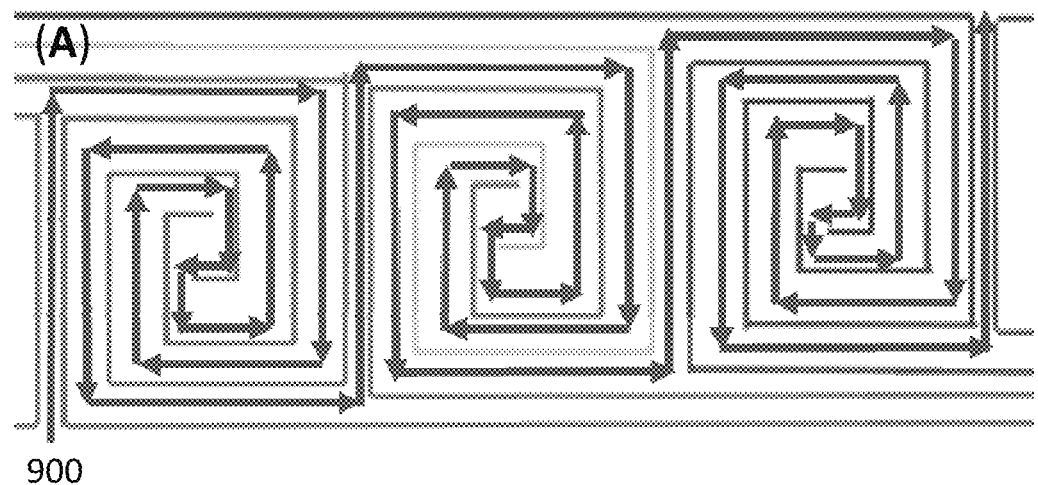
FIG. 9 shows moisture ingress paths for seal ring structures of embodiments of the disclosure, the seal ring structures having (A) a swirl pattern, (B) a jigsaw maze pattern and (C) a serrated (in this instance, lightning bolt) pattern.
Figure 9:
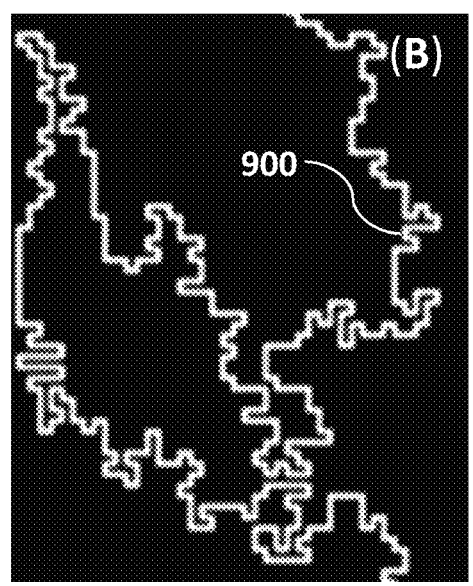
Figure 9:
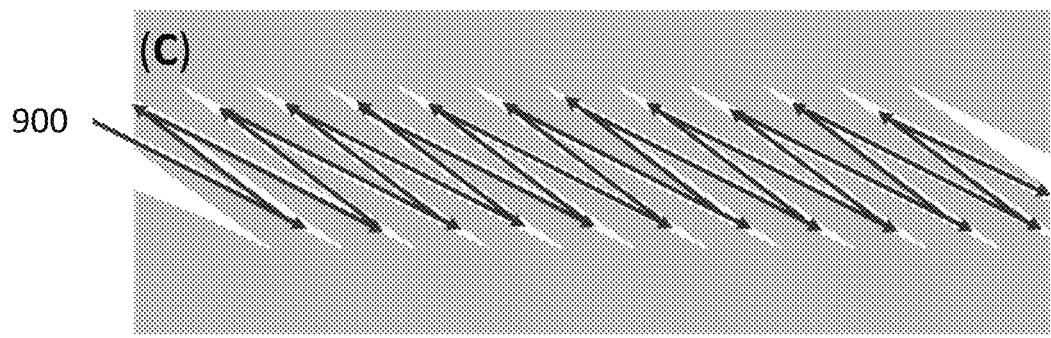

FIG. 9 depicts long non-linear moisture paths 900 for (A) a swirl pattern, (B) a jigsaw maze pattern and (C) a serrated (in this instance, lightning bolt) pattern. As noted above, these moisture paths are so long that moisture ingress to the IC core is nearly impossible, if not entirely impossible.

If it is, however, desired to have additional moisture blocking, nitride barrier walls can be incorporated into the seal ring structures of the disclosure. More specifically, one or more nitride barrier walls can be formed between seal walls, thereby forming hematic seals that are impermissible to moisture. Such nitride barrier walls do not compromise the noise propagation prevention even though they form connections between the seal walls due to their non-metallic nature. Moreover, these nitride barrier walls provide additional crack propagation protection as well.

Figure 10:
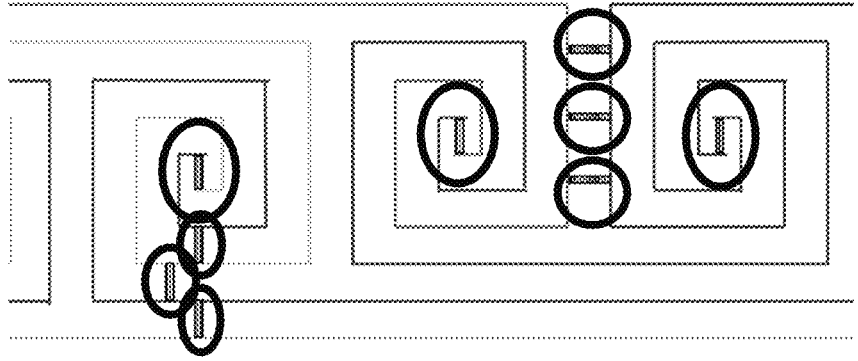
FIG. 10 shows nitride barrier walls (see circles) formed between seal walls of seal ring structures of embodiments of the disclosure, the seal ring structures having (A) a swirl pattern, (B) a jigsaw maze pattern and (C) a serrated (in this instance, hook) pattern.
Figure 10:
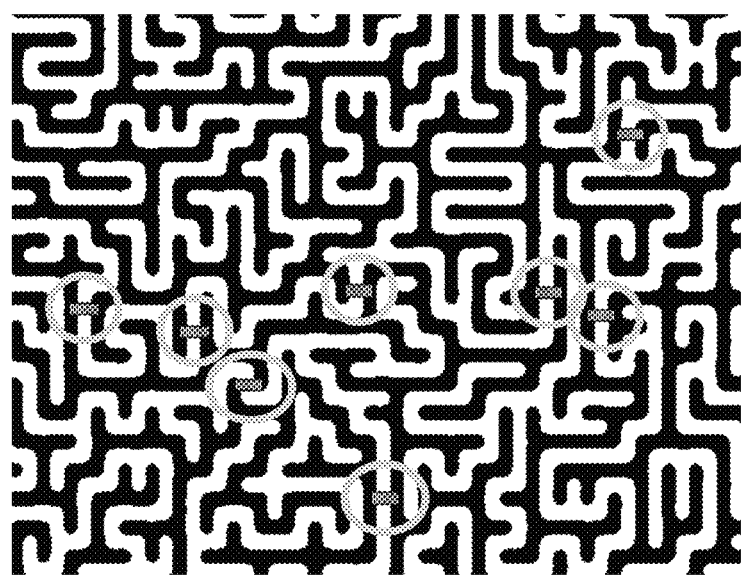
Figure 10:
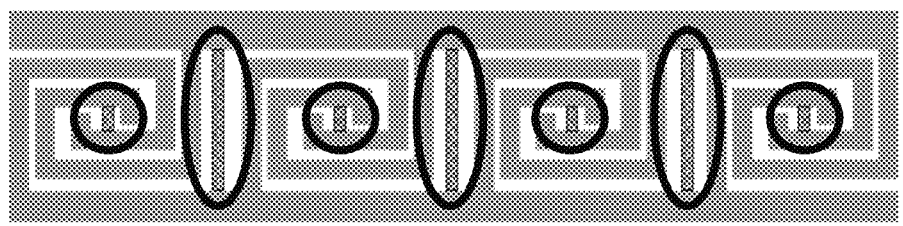

FIG. 10 depicts seal ring structures according to embodiments of the disclosure wherein nitride barrier walls (circled) have been formed within (A) a swirl pattern, (B) a jigsaw maze pattern and (C) a serrated (in this instance, hook) pattern.

Additional features that can be incorporated into the seal ring structures of the disclosure include for example, ground contacts attached to the seal walls for noise propagation prevention, a dehydration liner on the seal walls along the non-linear path for moisture ingress prevention, and supplemental metal lines or air gaps formed at ends of the non-linear path for both noise propagation and moisture ingress prevention.

Figure 11:
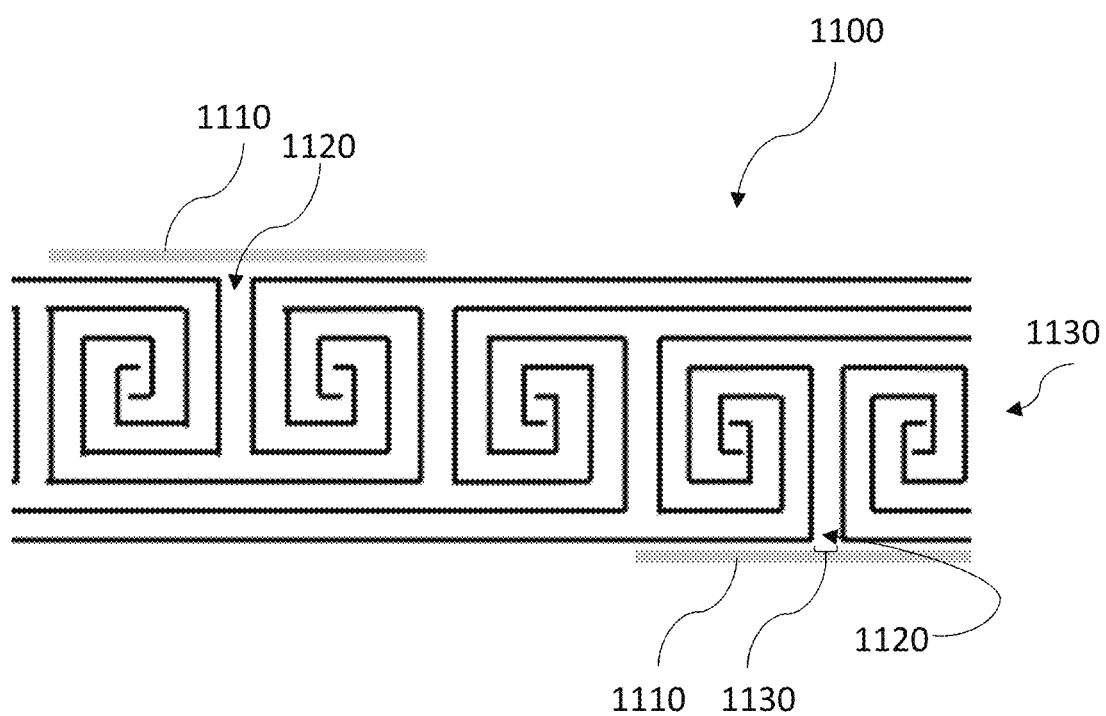
FIG. 11 shows supplemental metal lines formed at openings of a seal ring structure of an embodiment of the disclosure.

FIG. 11 depicts a seal ring structure 1100 according to an embodiment of the disclosure wherein a supplemental metal line 1110 is formed at both ends 1120 of the non-linear path created by the space between seals walls 1130. In this example, supplemental metal lines 1110 each have a length greater than a width 1130 of path ends 1120. In other examples, the supplemental metal lines may have lengths equal to width 1130 of a path end. In this example, supplemental metal lines 1110 are formed at both ends 1120 of the path; however, in other examples, the supplemental metal lines may be formed at only one end of the path. While FIG. 11 depicts seal ring structure 1100 having a swirl pattern, supplemental metal line 1110 may be applied to any seal wall pattern described herein.

Figure 12A:
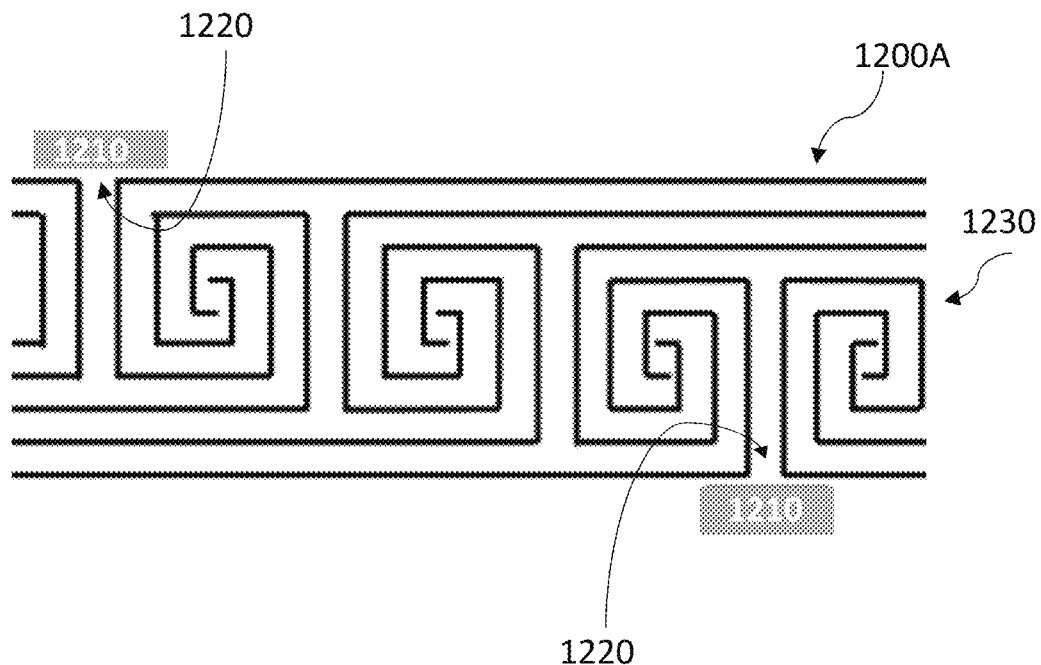
FIG. 12 shows air gaps formed at openings of a seal ring structure (A, B) as well as within the seal ring structure (B) according to embodiments of the disclosure.
Figure 12B:
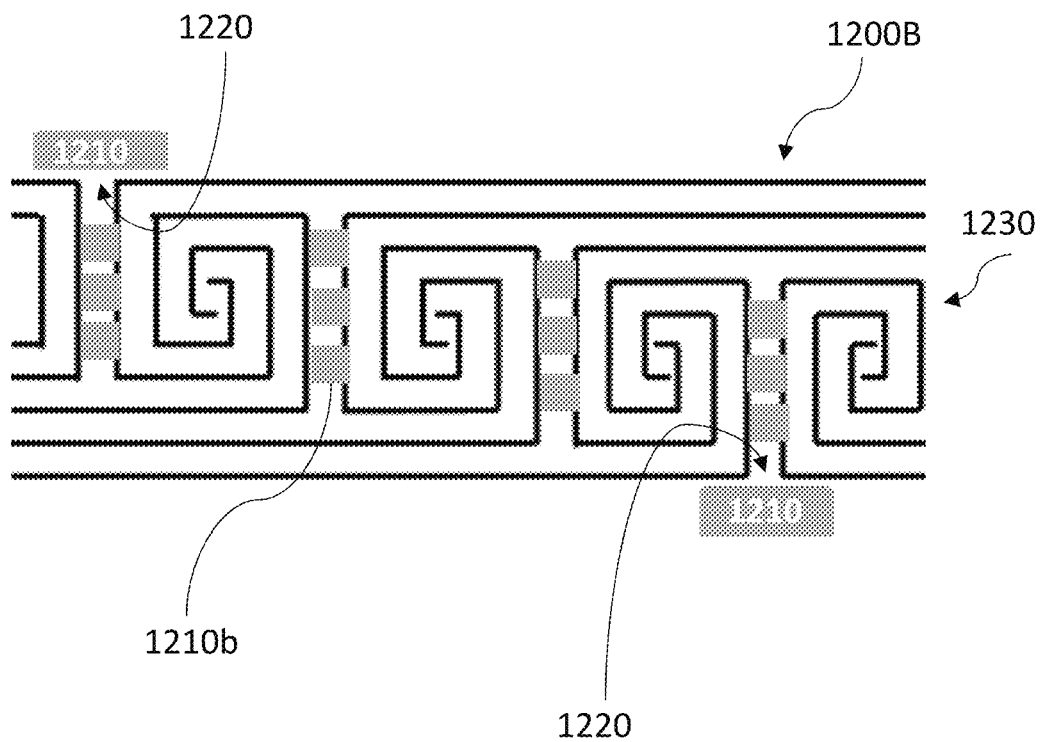

FIG. 12 depicts seal ring structures 1200A and 1200B according to embodiments of the disclosure wherein an air gap 1210 is formed at both ends 1220 of the non-linear path created by the space between seal walls 1230. In these examples, air gaps 1210 are formed at both ends 1220 of the path; however, in other examples, the air gaps may be formed at only one end of the path. While FIG. 12 depicts seal ring structures 1200 having a swirl pattern, air gap 1210 may be applied to any seal wall pattern described herein. Seal ring structure 1200A has air gaps 1210 at ends 1220, whereas seal ring structure 1200B has air gaps 1210 at ends 1220 as well as air gaps 1210b at locations within and throughout seal ring structure 1200B.

Air gaps 1210 can be cavity structures located within back-end-of-line (BEOL) layers of an IC. In other words, air gaps 1210 can be small vacuum voids within a dielectric material matrix that metal vias and other features can be built into. Air gaps 1210 can reduce parasitic capacitance (noise/signals) between adjacent seal walls. Air gaps 1210 can also assist in crack trapping or breaking up an impinging crack's trajectory.

A further enhancement to the seal ring structures of the disclosure includes a mechanism to shield and reduce load capacitance effects which induce noise voltage from grounds. Such a mechanism may include the incorporation of guarding elements. In embodiments of the disclosure, further noise reduction can be obtained when the seal ring structure includes one or more pedestal guard rings. Each pedestal guard ring includes a metal segment formed on top of a doped, electrically functional portion of the IC's substrate. Both the metal segment and the doped portion of substrate can be formed in the shape of the pattern of the seal walls. The pedestal guard ring provides a path for a surface charge to ground to the substrate.

Figure 13A:
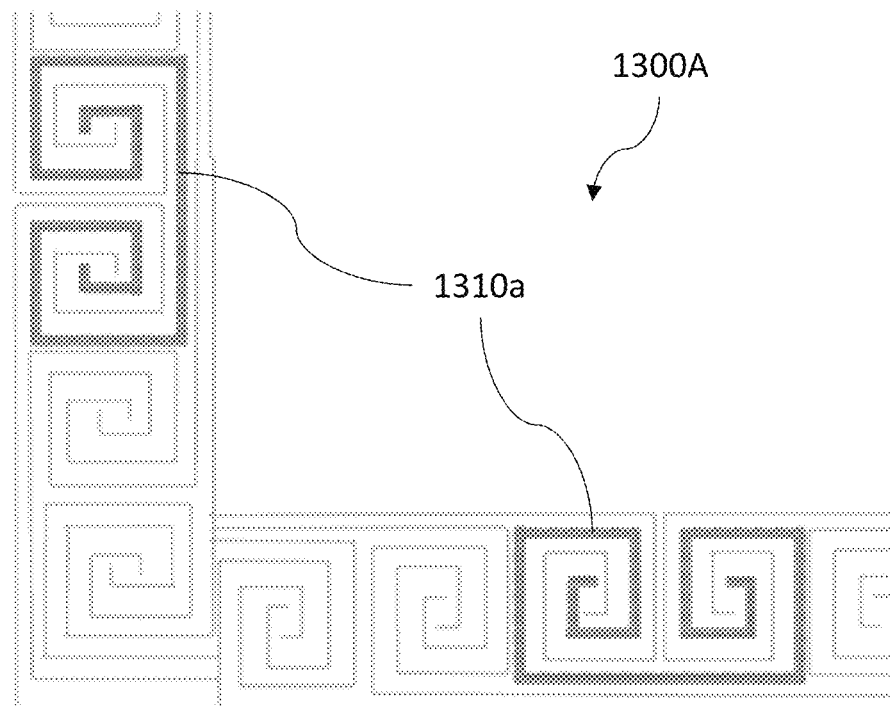
FIG. 13 shows pedestal guard rings (i.e., metal segments) formed in the shape of the pattern of the seal walls (A: swirl pattern, B: serrated/tooth pattern), formed on top of the integrated circuit's substrate, and formed in a seal wall position, according to embodiments of the disclosure.
Figure 13B:
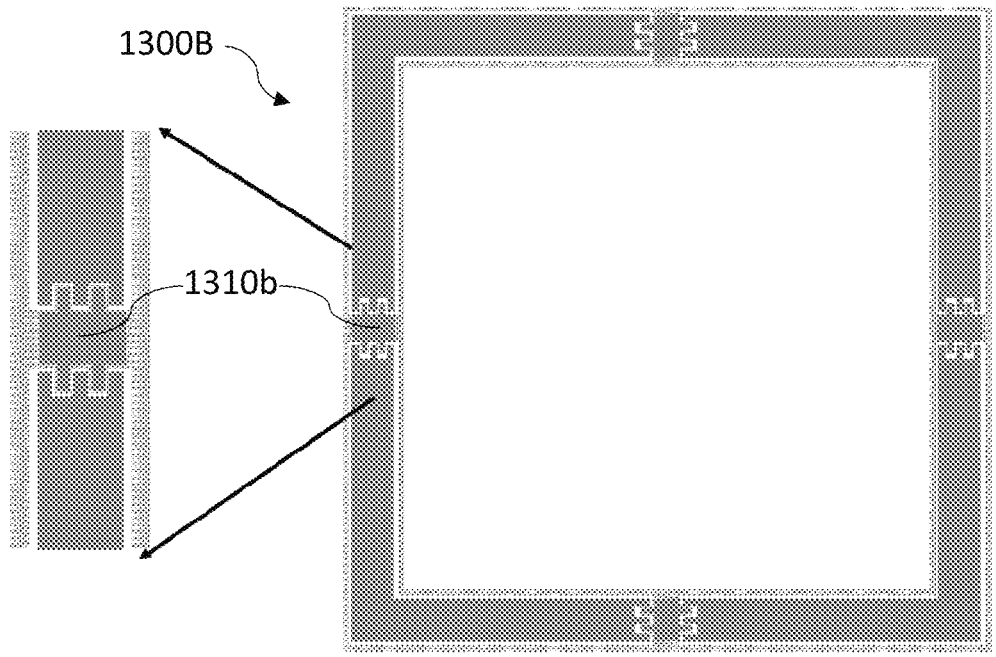

FIG. 13 depicts a seal ring structure 1300A according to an embodiment of the disclosure wherein a pedestal guard ring 1310a is formed at two different seal wall positions. In this example, pedestal guard rings 1310a are formed at two different seal wall positions; however, in other examples, the pedestal guard rings may be formed at only one seal wall position or at all seal wall positions. While FIG. 13 depicts seal ring structure 1300A having a swirl pattern, pedestal guard ring 1310a may be applied to any seal wall pattern described herein. For instance, seal ring structure 1300B according to an embodiment of the disclosure depicts a pedestal guard ring 1310b that utilizes the serrated seal wall pattern, in this instance a tooth pattern. Furthermore, it is noted here that seal ring structure 1300B depicts a doped ring (light gray area) around the perimeter of structure 1300B and under pedestal guard ring 1310b. In FIG. 13, pedestal guard rings 1310 are located within seal ring structure 1300, this is different from conventional placement where pedestal guard rings are typically placed outside of the seal ring structure.

As mentioned above, doped substrate areas can be incorporated within the seal ring structures of the disclosure. Doped substrate areas can be located beneath the pedestal guard ring footprint, or beneath any openings, gaps or paths created by the pattern of the pedestal guard ring. Doped areas beneath such openings, gaps or paths may extend to walls of the pedestal guard ring or may not fully extend to the walls and instead leave an undoped area between the doped area and the walls of the pedestal guard ring. Doped areas at gaps/openings having a dopant concentration that is dissimilar to a dopant concentration directly beneath a seal wall or pedestal guard ring will increase the resistivity of noise propagation across the gap/opening. N-type and/or p-type dopants can be used.

Figure 14:
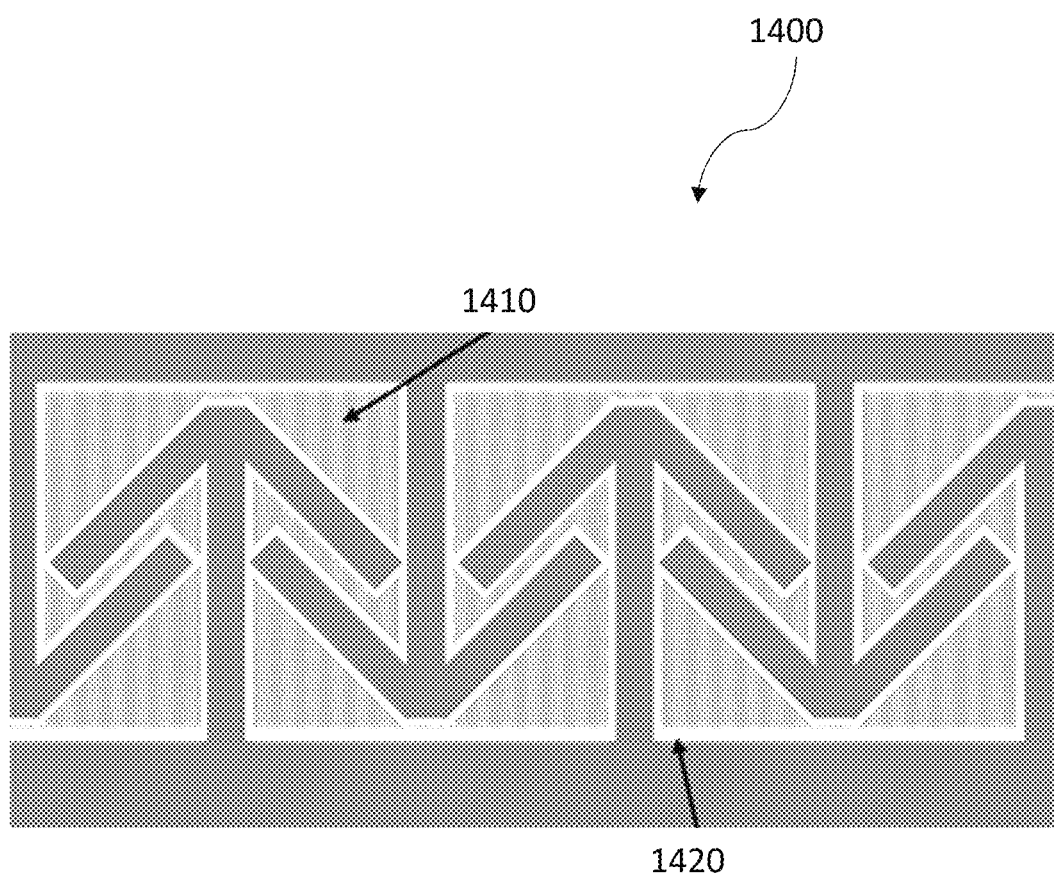
FIG. 14 shows doped and undoped regions between seal walls according to an embodiment of the disclosure.

FIG. 14 depicts a seal ring structure 1400 according to an embodiment of the disclosure wherein a doped substrate area 1410 (light grey area) and an undoped substrate area 1420 (white area) are shown. In this example, doped substrate area 1410 would further assist in noise reduction/cancellation. While FIG. 14 depicts seal ring structure 1400 having a serrated (arrow) pattern, any seal wall pattern is applicable.

Regardless of the seal wall pattern utilized, the seal ring structures for an IC of the disclosure are formed by a method including: forming on a substrate a first discontinuous seal wall circumscribing a first portion of the integrated circuit, the first seal wall having a first pattern, and forming on the substrate a second discontinuous seal wall circumscribing a second portion of the integrated circuit, the second seal wall having a second pattern, wherein the first and second seal walls are formed such that they interlock and the first and second patterns interweave without intersecting, wherein a space is formed between the seal walls, the space creating a non-linear path to the integrated circuit, and wherein the seal ring structure fully circumscribes the integrated circuit.

One of many benefits of the seal ring structures of this disclosure is that these structures can be made using traditional layer by layer fabrication processing or by using through-dielectric processing to create solid monolithic metal (e.g., copper) walls. Through-dielectric processing, i.e. opening trenches in BEOL dielectrics and then filling with metal (e.g., copper), results in solid metal/copper walls that do not have interfaces between layers like those seen as a result of the layer by layer processing.

Figure 15:
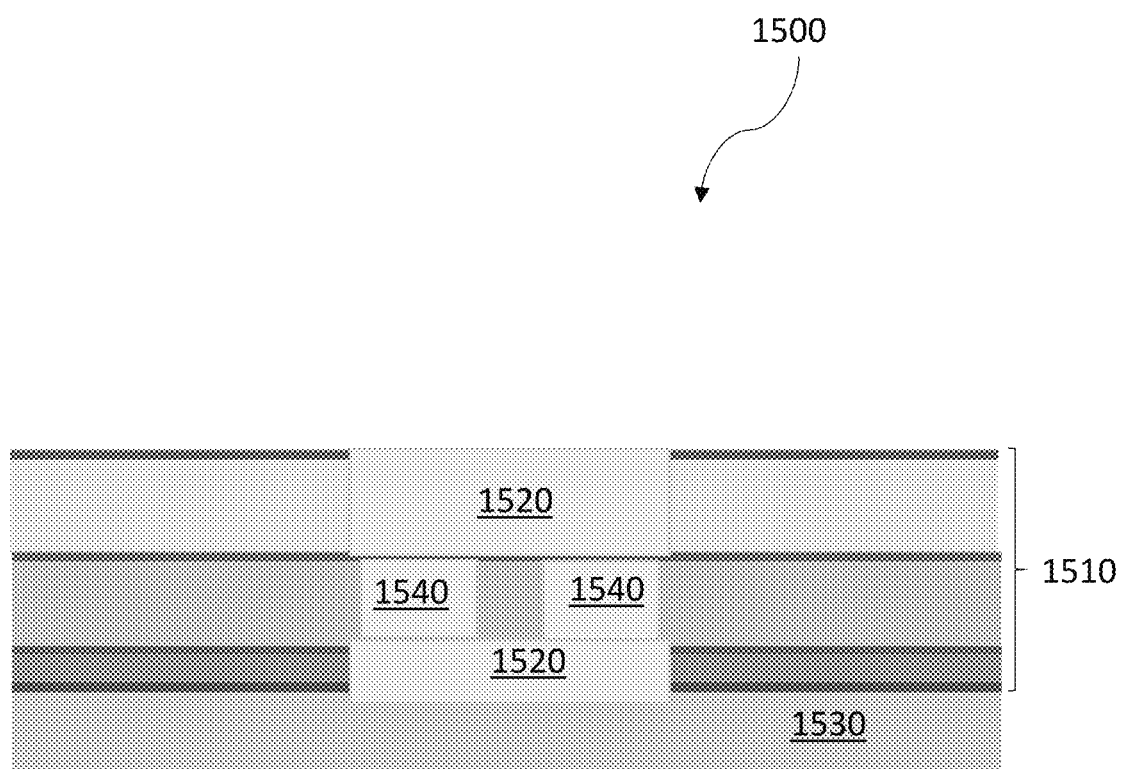
FIG. 15 shows a cross-section of a seal ring structure of an embodiment of the disclosure wherein traditional layer by layer fabrication processing was used.

FIG. 15 depicts a cross-section of a seal ring structure 1500 of an embodiment of the disclosure wherein traditional layer by layer fabrication processing was used. Seal ring structure 1500 includes multiple layers 1510, metal plates 1520 and via bars 1540 sandwiched therebetween; the seal ring structure 1500 being formed on top of a substrate 1530.

Figure 16:
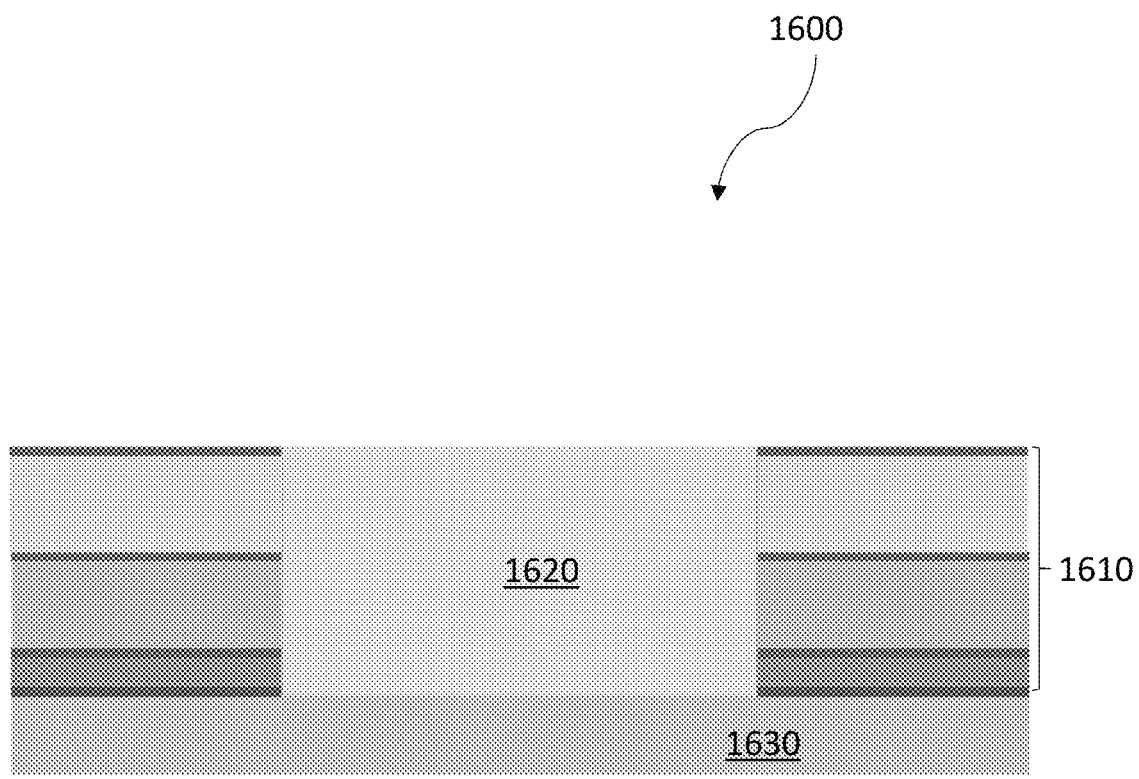
FIG. 16 shows a cross-section of a seal ring structure of an embodiment of the disclosure wherein through-dielectric processing was used.

FIG. 16 depicts a cross-section of a seal ring structure 1600 of an embodiment of the disclosure wherein through-dielectric processing was used. Seal ring structure 1600 includes multiple layers 1610 and a single metal plate 1620; the seal ring structure 1600 being formed on top of a substrate 1630.

If through-dielectric processing is used, solid uniform metal (e.g., copper) segments are formed that have no weak seams or interfaces between layers (because there are no layers) which provides a significant increase in fracture toughness and mechanical stability. Due to more effective crack trapping when this construction is used, a lower failure rate and better reliability of products is expected.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

We claim:

1. A seal ring structure of an integrated circuit, comprising:
   a first discontinuous seal wall circumscribing a first portion of the integrated circuit, the first seal wall forming a first pattern on a substrate; and
   a second discontinuous seal wall circumscribing a second portion of the integrated circuit, the second seal wall forming a second pattern on the substrate and the second portion being at least partially offset from the first portion;
   wherein the first pattern of the first seal wall interlocks with the second pattern of the second seal wall such that the patterns are interweaved without intersecting;
   wherein a space is formed between the seal walls, the space creating a non-linear path to the integrated circuit; and
   wherein the seal ring structure fully circumscribes the integrated circuit, and the first and second patterns are concentric open spirals.

2. The seal ring structure of claim 1, wherein the non-linear path is approximately 150 micrometers (μm) or more in length.

3. The seal ring structure of claim 1, wherein the seal walls are lined with a dehydration liner along the non-linear path.

4. The seal ring structure of claim 1, wherein the space formed between the seal walls comprises one or more nitride barrier walls forming a connection between the first and second seal walls.

5. The seal ring structure of claim 1, wherein the substrate is doped in at least one area located between the seal walls and at one end of the non-linear path.

6. The seal ring structure of claim 1, wherein the substrate is doped in an area located between the seal walls and along the non-linear path.

7. The seal ring structure of claim 1, wherein a supplemental metal line is formed at one or both ends of the non-linear path, the supplemental metal line having a length equal to or greater than a width of an opening of an end of the non-linear path.

8. The seal ring structure of claim 1, wherein an air gap is formed at one or both ends of the non-linear path, the air gap having a length equal to or greater than a width of an opening of an end of the non-linear path.

9. The seal ring structure of claim 1, wherein at least one of the first and second seal walls is grounded.

10. The seal ring structure of claim 1, further comprising one or more pedestal guard rings, wherein each pedestal guard ring includes a metal segment formed on top of the substrate and in the shape of the pattern of the first or second seal walls, the substrate being doped at the position of the one or more pedestal guard rings.

11. The seal ring structure of claim 1, wherein the concentric open spirals are interweaved such that both spirals wind clockwise or both spirals wind counter-clockwise.

12. The seal ring structure of claim 1, wherein a given seal wall comprises one or more concentric open spirals.

13. The seal ring structure of claim 1, wherein the first pattern includes a first shape of a jigsaw maze and the second pattern includes a second shape of the jigsaw maze, the first and second shapes being complementary to one another and unconnected.

14. The seal ring structure of claim 13, wherein the non-linear path is created at a complementary interface between the first and second patterns.

15. The seal ring structure of claim 1, wherein the first and second patterns include serrated patterns.

16. The seal ring structure of claim 15, wherein the serrated patterns are at least one selected from the group consisting of a squared tooth pattern, a sawtooth pattern, an arrow pattern, an anchor pattern, a zipper pattern, a lightning bolt pattern, a hook pattern, and an elephant tail pattern.

17. A method of forming a seal ring structure of an integrated circuit, comprising:
    forming on a substrate a first discontinuous seal wall circumscribing a first portion of the integrated circuit, the first seal wall having a first pattern, and
    forming on the substrate a second discontinuous seal wall circumscribing a second portion of the integrated circuit, the second seal wall having a second pattern,
    wherein the first and second seal walls are formed such that they interlock and the first and second patterns interweave without intersecting and a space is formed between the seal walls such that a non-linear path to the integrated circuit is created, and
    wherein the seal ring structure fully circumscribes the integrated circuit, and the first and second patterns are concentric open spirals.

18. The method of claim 17, wherein the forming of the first and second seal walls is performed by a layer by layer fabrication process.

19. The method of claim 17, wherein the forming of the first and second seal walls is performed by a through-dielectric process.

* * * * *